(12) United States Patent
Shakuda

(10) Patent No.: US 8,097,532 B2
(45) Date of Patent: Jan. 17, 2012

(54) METHOD FOR MANUFACTURING A SEMICONDUCTOR LIGHT EMITTING DEVICE

(75) Inventor: Yukio Shakuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 220 days.

(21) Appl. No.: 12/086,174

(22) PCT Filed: Dec. 4, 2006

(86) PCT No.: PCT/JP2006/324152
§ 371 (c)(1),
(2), (4) Date: Aug. 14, 2009

(87) PCT Pub. No.: WO2007/066605
PCT Pub. Date: Jun. 14, 2007

(65) Prior Publication Data
US 2009/0305448 A1   Dec. 10, 2009

(30) Foreign Application Priority Data
Dec. 8, 2005   (JP) ................ P2005-355299

(51) Int. Cl.
*H01L 21/28* (2006.01)
(52) U.S. Cl. ............ 438/605; 438/660; 257/E21.159; 257/E33.062
(58) Field of Classification Search ........... 438/604, 438/605, 660; 257/E21.135, E21.159, E33.066, 257/E33.062
See application file for complete search history.

(56) References Cited

U.S. PATENT DOCUMENTS

| 6,693,352 B1 * | 2/2004 | Huang et al. ............ 257/743 |
| 2004/0000670 A1 * | 1/2004 | Oh et al. ............ 257/76 |
| 2004/0000671 A1 * | 1/2004 | Oh et al. ............ 257/79 |
| 2005/0104081 A1 | 5/2005 | Kim et al. |
| 2005/0142820 A1 * | 6/2005 | Kim ............ 438/516 |

FOREIGN PATENT DOCUMENTS

| JP | 2005-011857 | 1/2005 |
| JP | 2005-150675 | 6/2005 |

* cited by examiner

*Primary Examiner* — Benjamin Sandvik
*Assistant Examiner* — Wensing Kuo
(74) *Attorney, Agent, or Firm* — Rabin & Berdo, P.C.

(57) ABSTRACT

To provide a method for manufacturing a semiconductor light emitting device capable of providing sufficiently low operating voltage.

The method for manufacturing a semiconductor light emitting device of the present invention includes: a semiconductor laminating step of laminating a plurality of nitride semiconductor layers of to form a semiconductor laminating structure; and an electrode forming step of forming n-side electrode and p-side electrodes on the n-type and p-type semiconductor layers. In the electrode forming step, after a first metallic layer including a Ni layer constituting a part of the n-side electrode is formed on a surface of a forming region of the n-side electrode, the first metallic layer is annealed in an atmosphere containing nitrogen and oxygen.

4 Claims, 5 Drawing Sheets

METHOD FOR MANUFACTURING A SEMICONDUCTOR LIGHT EMITTING DEVICE

FIELD OF THE INVENTION

The present invention relates to a method for manufacturing a semiconductor light emitting device including an electrode formation step of forming an n-side electrode on a predetermined semiconductor layer.

BACKGROUND ART

There are known methods for manufacturing semiconductor light emitting devices including an electrode formation step of forming an n-side electrode having a metallic layer composed of Ni on a semiconductor layer.

For example, Patent Literature 1 discloses a method for manufacturing a semiconductor light emitting device including an n-type semiconductor layer, a p-type semiconductor layer, a p-side electrode, and an n-side electrode sequentially laminated on a substrate.

The n-type semiconductor layer is formed on the substrate. On the n-type semiconductor layer, the p-type semiconductor layer is formed. The p-type semiconductor layer is partially removed by etching so that a part of the n-type semiconductor layer is exposed. A part of the p-side electrode is provided for a part of the p-type semiconductor layer remaining without being removed, and the n-side electrode is provided for a part an area where the n-type semiconductor layer is exposed. Each of the p-side and n-side electrodes is composed of a laminating layered structure of Ni, Ti, and Au.

In the method for manufacturing a light emitting device, the n-type and p-type semiconductor layers are laminated on the substrate, and then a part of the p-type semiconductor layer is removed by etching to expose a part of the n-type semiconductor layer. Next, a patterned resist film is formed on a predetermined region of the p-type and n-type semiconductor layers. Subsequently, Ni, Ti, and Au are sequentially layered by vacuum deposition to form a metallic layer. Part of the metallic layer on the resist film is removed by the lift-off process to form the p-side and n-side electrodes.

Herein, in the semiconductor light emitting device of Patent Literature 1, in order to reduce the contact resistance between the p-side and n-side electrodes and respective p-type and n-type semiconductor layers, the Ni and Ti metallic layers are formed in a thin thickness such that the adhesion between the both electrodes and both semiconductor layers in an not-degraded level are attained. It is therefore possible to reduce operating voltage of the semiconductor light emitting device to some extent.

Patent Literature 1 Japanese Patent Laid-open Publication No. 9-232632

DISCLOSURE OF THE INVENTION

Problems to be Solved by the Invention

However, there is a limit to reduce the operating voltage of the semiconductor light emitting device by reducing the thickness of the Ni and Ti metallic layers constituting the n-side electrode, and the operating voltage is not sufficiently reduced yet.

The contact resistance between the n-type semiconductor layer and Ni can be reduced by annealing Ni in a $H_2$ or $N_2$ atmosphere to diffuse Ni into the n-side electrode. However, this cannot sufficiently reduce the operating voltage.

The present invention was made to solve the aforementioned problem, and an object of the present invention is to provide a method for manufacturing a semiconductor light emitting device which can provide sufficiently low operating voltage.

Means for Solving the Problem

To achieve aforementioned object, a method for manufacturing a semiconductor light emitting device according to the invention includes a semiconductor laminating step of laminating a plurality of nitride semiconductor layers to form a semiconductor laminating structure; and an electrode forming step of forming electrodes on any of the semiconductor layers. In the electrode forming step, after a metallic layer including a Ni layer constituting a part of the n-side electrode is formed on a surface of a forming region of the n-side electrode, the metallic layer is annealed in an atmosphere containing oxygen.

According to an aspect of the invention in the electrode forming step, the metallic layer is annealed in the atmosphere containing oxygen after the metallic layer is simultaneously laminated on a forming region of the p-side electrode.

According to another aspect of the invention, the annealing in the atmosphere containing oxygen is performed in an atmosphere at 500 to 800° C.

According to still another aspect of the invention, the metallic layer is composed of Ni and Au layers.

According to a further aspect of the invention, the annealing is performed in an atmosphere containing nitrogen and oxygen.

EFFECT OF THE INVENTION

According to the present invention, annealing the metallic layer of the n-side electrode in the atmosphere containing oxygen allows a large amount of Ni contained in the Ni layer of the metallic layer to be diffused into the semiconductor layer. It is therefore possible to reduce contact resistance between the semiconductor layer and the metallic layer of the n-side electrode. Moreover, a part of Ni is oxidized into nickel oxide to increase the light transmittance of the metallic layer. This allows more light to be emitted to the outside.

EXPLANATION OF REFERENCE NUMERALS

1, SEMICONDUCTOR LIGHT EMITTING DEVICE
1A, SEMICONDUCTOR LIGHT EMITTING DEVICE
1B, SEMICONDUCTOR LIGHT EMITTING DEVICE
2, SUBSTRATE
2B, SUBSTRATE
3, n-TYPE SEMICONDUCTOR LAYER
4, ACTIVE LAYER
5, p-TYPE SEMICONDUCTOR LAYER
6, p-SIDE ELECTRODE
6B, p-SIDE ELECTRODE
7, n-SIDE ELECTRODE
7A, n-SIDE ELECTRODE
7B, n-SIDE ELECTRODE
11, FIRST METALLIC LAYER
12, SECOND METALLIC LAYER
12B, SECOND METALLIC LAYER
13, FIRST METALLIC LAYER
13A, FIRST ELECTRODE LAYER
14, SECOND METALLIC LAYER
14B, SECOND METALLIC LAYER
30, LIGHT EMITTING DEVICE
31, INSULATING FILM

BEST MODE FOR CARRYING OUT THE INVENTION

Figure 1:
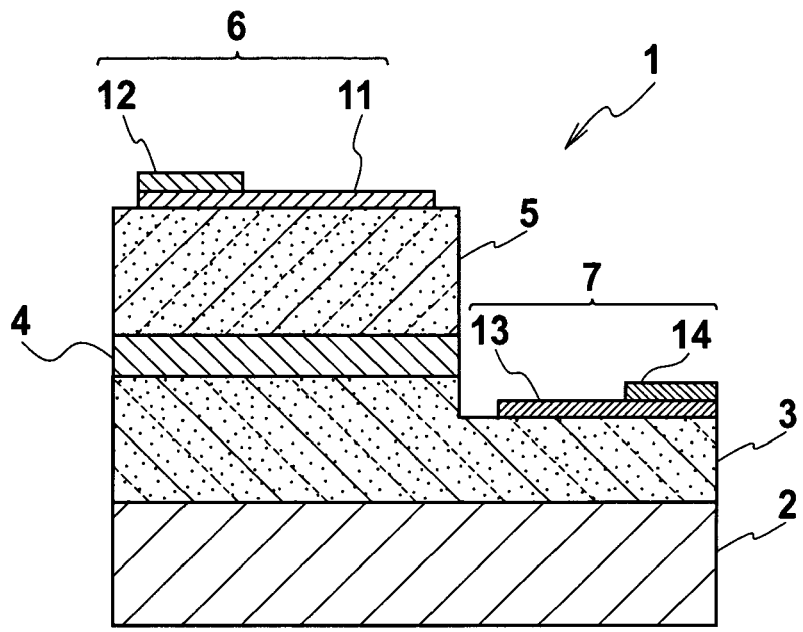
FIG. 1 is a view showing a cross-sectional structure of a semiconductor light emitting device manufactured by a manufacturing method according to the present invention.
Figure 2:
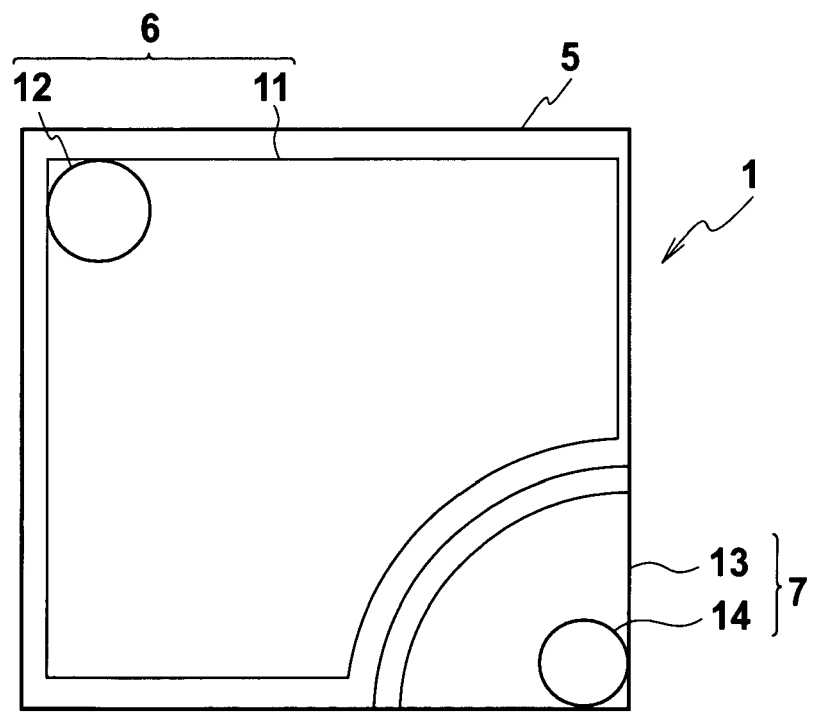
FIG. 2 is a view showing a planar structure of the semiconductor light emitting device manufactured by the manufacturing method according to the present invention.

Hereinafter, a description is given of an embodiment of the present invention with reference to the drawings. FIG. 1 is a view showing a cross-sectional structure of a semiconductor light emitting device manufactured by a manufacturing method according to the present invention. FIG. 2 is a view showing a planer structure of the semiconductor light emitting device manufactured by the manufacturing method according to the present invention.

As shown in FIGS. 1 and 2, a semiconductor light emitting device 1 includes a substrate 2, an n-type semiconductor layer 3, an active layer 4, a p-type semiconductor layer 5, a p-side electrode 6, and an n-side electrode 7. The n-type semiconductor layer 3, active layer 4, and p-type semiconductor layer 5 constitutes a semiconductor laminating structure.

The substrate 2 is composed of a sapphire substrate. The n-type semiconductor layer 3 is formed on the substrate 2 and composed of an n-GaN layer containing an n-type dopant such as Si. The active layer 4 is formed on a part of the n-type semiconductor layer 3 and has a multiple-quantum well structure including a plurality of quantum well layers composed of InGaN layers. The p-type semiconductor layer 5 is formed on the active layer 4 and is composed of a p-GaN layer containing a p-type dopant such as Mg. A part of the active layer 4 and p-type semiconductor layer 5 is removed by etching so as to expose a part of the upper surface of the n-type semiconductor layer 3.

The p-side electrode 6 includes a first metallic layer 11 and a second metallic layer 12. The first metallic layer 11 is formed so as to cover substantially the entire upper surface of the p-type semiconductor layer 5 and is capable of transmitting light emitted by the active layer 4. The first metallic layer 11 is composed of an about 40 Å thick Ni layer formed on the p-type semiconductor layer 5 and an about 80 Å thick Au layer formed on the Ni layer.

The second metallic layer 12 of the p-side electrode 6 is formed in a circle with a diameter of about 100 μm so as to cover a part (a corner part) of the upper surface of the first metallic layer 11. The second metallic layer 12 is an about 500 Å thick Ti layer formed on the first metallic layer 11 and an about 2000 Å thick Au layer formed on the Ti layer.

The n-side electrode 7 includes a first metallic layer 13 and a second metallic layer 14. The first metallic layer 13 corresponds to a metallic layer described in claims of the present invention. The first metallic layer 13 is formed so as to cover substantially the entire exposed part of upper surface of the n-type semiconductor layer 3. The first metallic layer 13 is configured to be capable of transmitting light which travels upward after being emitted from the active layer 4, traveling downward in FIG. 1, and being reflected. The first metallic layer 13 is composed of an about 40 Å thick Ni layer formed on the n-type semiconductor layer 3 and an about 80 Å thick Au layer formed on the Ni layer.

The second metallic layer 14 of the n-side electrode 7 is formed in a circle with a diameter of about 100 μm so as to cover a part (a corner part) of the upper surface of the first metallic layer 13. The second metallic layer 14 is composed of an about 500 Å thick Ti layer formed on the first metallic layer 13 and an about 2000 Å thick Au layer formed on the Ti layer. In other words, the p-side electrode 6 and the n-side electrode 7 are composed of same materials with same thicknesses. The distance between the second metallic layer 12 of the p-side electrode 6 and the second metallic layer 14 of the n-side electrode 7 is about 400 μm.

In the semiconductor light emitting device 1, when voltage is applied between the p-side electrode 6 and the n-side electrode 7, holes are injected from the p-side electrode 6, and electrons are injected from the n-side electrode 7. The injected holes and electrodes are injected into the active layer 4 through the p-type semiconductor layer 5 and the n-type semiconductor layer 3 are recombined. Light emitted by the recombination of the holes and electrons is transmitted through the p-type semiconductor layer 5 and the first metallic layer 11 of the p-side electrode 6 to be emitted to the outside.

Next, a description is given of a method for manufacturing the semiconductor light emitting device 1 with reference to the drawings. FIGS. 3 to 6 are views showing the cross-sectional structure of the semiconductor light emitting device at individual manufacturing steps of the manufacturing method according to the present invention.

Figure 3:
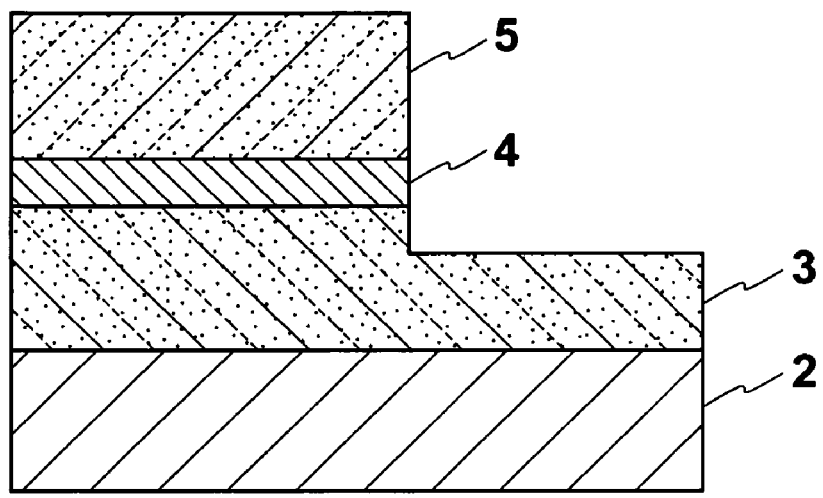
FIG. 3 is a view showing a cross-sectional constitution of the semiconductor light emitting device at a manufacturing step of the manufacturing method according to the present invention.

First, at a semiconductor laminating step, the n-type semiconductor layer 3, active layer 4, and p-type semiconductor layer 5 are sequentially laminated on the substrate 2 by a known semiconductor growth method such as MOCVD. Next, as shown in FIG. 3, a part of the p-type semiconductor layer 5, active layer 4, and n-type semiconductor layer 3 is etched to expose a part of the n-type semiconductor layer 3.

Figure 4:
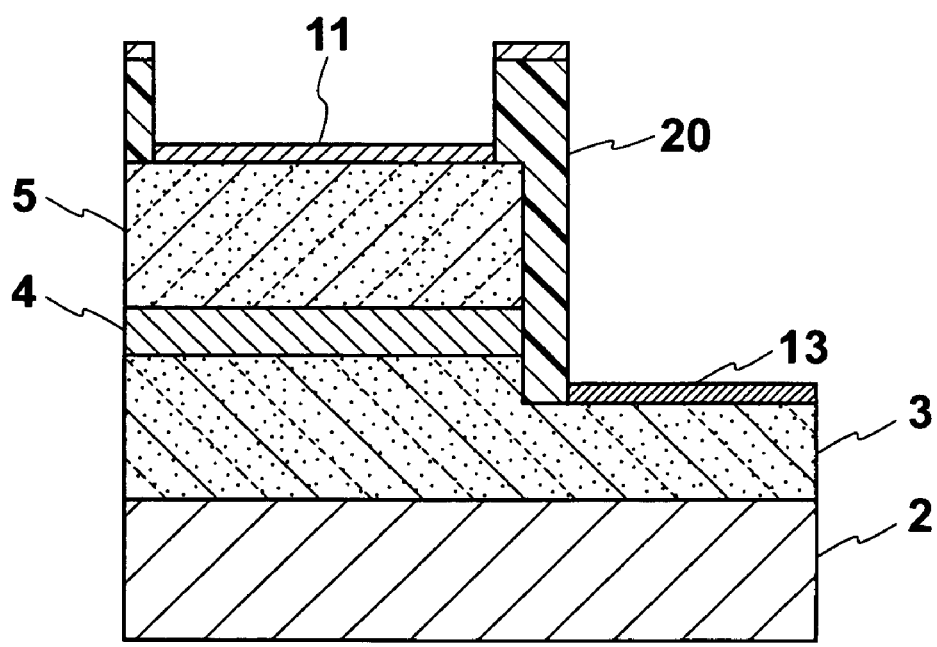
FIG. 4 is a view showing a cross-sectional constitution of the semiconductor light emitting device at another manufacturing step of the manufacturing method according to the present invention.

Next, at an electrode forming step, as shown in FIG. 4, a resist film 20, which is patterned so as to cover the upper surface of the regions except the regions where the first metallic layers 11 and 13 of the p-side electrode 6 and the n-side electrode 7 are formed, is formed by photolithography. Next, an about 40 Å thick Ni layer and an about 80 Å thick Au layer constituting the first metallic layers 11 and 13 of the p-side electrode 6 and the n-side electrode 7 are sequentially formed by EB (electron beam) deposition.

Figure 5:
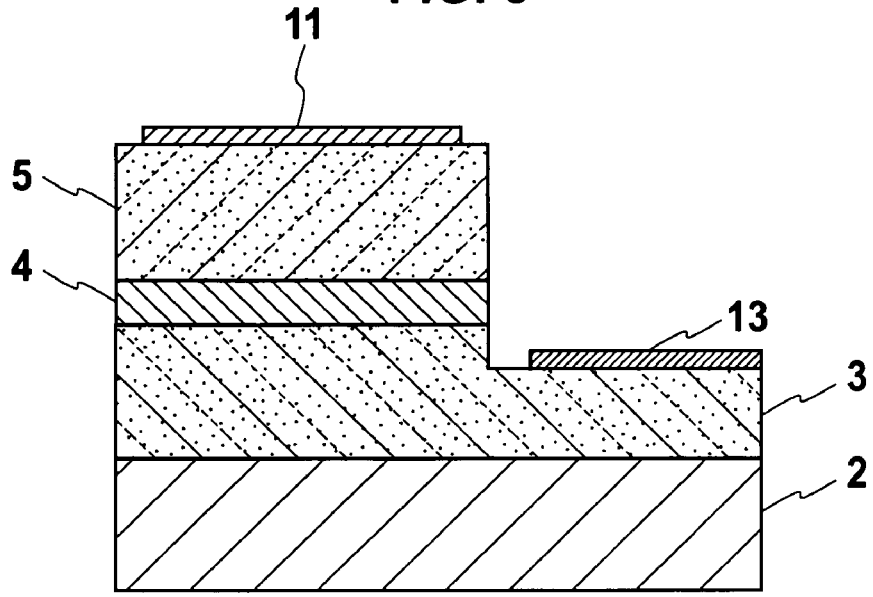
FIG. 5 is a view showing a cross-sectional constitution of the semiconductor light emitting device at still another manufacturing step of the manufacturing method according to the present invention.

Next, as shown in FIG. 5, a part of the Ni and Au layers on the resist film 20 are removed together with the resist film 20 to form the patterned first metallic layer 11 of the p-side electrode 6 and the patterned first metallic layer 13 of n-side electrode 7. Thereafter, the first metallic layer 13 is annealed for about ten minutes in an atmosphere of nitrogen and oxygen in a ratio of 4/1 with a pressure equal to atmospheric pressure at about 600° C. (a first annealing step).

Annealing in the atmosphere containing oxygen as described above allows a large mount of Ni contained in the Ni layer of the first metallic layer 13 of the n-side electrode 7 to be diffused into the n-type semiconductor layer 3. Moreover, a part of Ni is oxidized into nickel oxide by the first annealing step.

Figure 6:
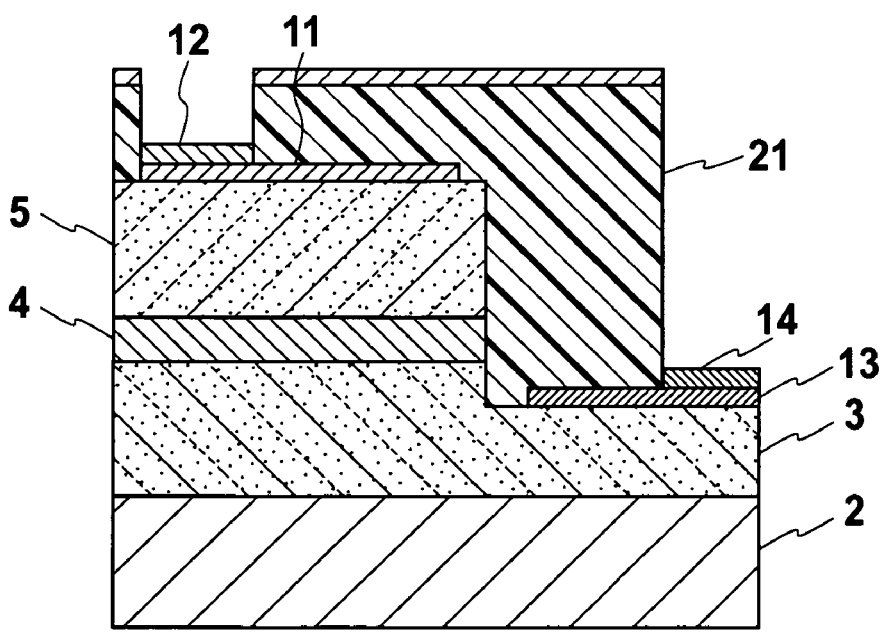
FIG. 6 is a view showing a cross-sectional constitution of the semiconductor light emitting device at still another manufacturing step of the manufacturing method according to the present invention.

Next, as shown in FIG. 6, a resist film 21, which is patterned so as to cover the upper surface except the regions where the second metallic layer 12 of the p-side electrode 6 and the second metallic layer 14 of n-side electrode 7 are formed, is formed using photolithography. Next, an about 500 Å Ti layer and an about 2000 Å thick Au layer constituting the second metallic layer 12 of the p-side electrode 6 and the second metallic layer 14 of n-side electrode 7 are sequentially formed by EB deposition.

Next, the second metallic layer 12 of the p-side electrode 6 and the second metallic layer 14 of n-side electrode 7 patterned by removing part of the Ti and Au layers on the resist film 21 together with the resist film 21 are annealed in a nitrogen atmosphere at about 600° C. (a second annealing step). The second annealing step allows the p-side electrode 6 and the n-side electrode 7 to be alloyed, thus finishing the electrode forming step. The semiconductor light emitting device 1 is thus completed.

As described above, in the manufacturing method of the semiconductor light emitting device according to the present invention, by annealing the first metallic layer 13 in the atmosphere containing oxygen at the first annealing step of the electrode forming step, a large amount of Ni contained in the Ni layer of the first metallic layer 13 of the n-side electrode 7 can be diffused into the n-type semiconductor layer 3.

This can reduce contact resistance between the n-type semiconductor layer 3 and the first metallic layer 13 of the n-side electrode 7. Such diffusion of a large amount of Ni into the n-type semiconductor layer 3 is thought to be because of nickel oxide oxidized by annealing.

Since a part of Ni is oxidized into nickel oxide, the light transmittance of the first metallic layer 13 of the n-side electrode 7 is increased. This allows light emitted by the active layer 4 to be emitted to the outside in large amounts. Moreover, the p-side electrode 6 and the n-side electrode 7 are composed of same metals, so that the p-side electrode 6 and the n-side electrode 7 are formed simultaneously at the electrode forming step. Accordingly, the manufacturing process can be simplified. Moreover, patterning the p-side and n-side electrodes simultaneously can prevent misalignment of the p-side electrode 6 and the n-side electrode 7. Furthermore, since the first annealing step is performed in the atmosphere of nitrogen and oxygen in a ratio of 4/1, which is substantially the same as that of air, with a pressure equal to the atmospheric pressure, the atmosphere can be easily prepared.

Next, a description is given of experiments to verify the improvement of the voltage characteristics of a semiconductor light emitting device produced by the manufacturing method of a semiconductor light emitting device according to the present invention.

A comparative semiconductor light emitting device was produced by a manufacturing method which was different from the manufacturing method of the present invention in the point that the first annealing step of annealing the first metallic layer in the atmosphere containing oxygen was omitted.

Figure 7:
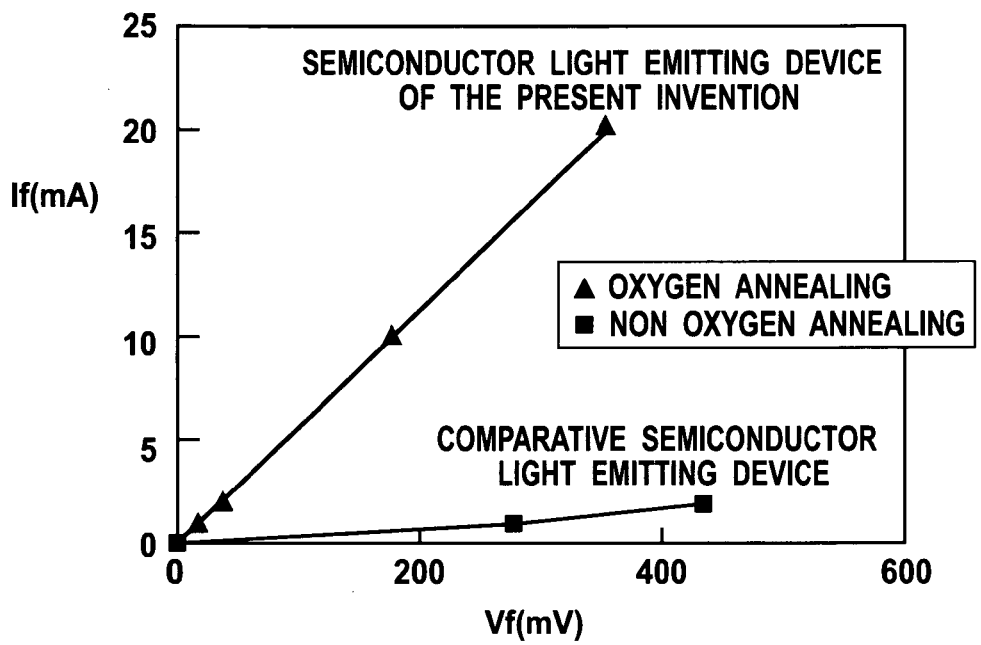
FIG. 7 is a graph showing relationships between voltage and current of a semiconductor light emitting device produced by the manufacturing method according to the present invention and a comparative semiconductor light emitting device.

FIG. 7 is a graph showing relationships between voltage and current between the p-side and n-side electrodes of the semiconductor light emitting device produced by the manufacturing method according to the present invention and the comparative semiconductor light emitting device. In FIG. 7, triangle symbols show experiment results of the semiconductor light emitting device manufactured by the manufacturing method of the present invention, and rectangle symbols show experiment results of the comparative semiconductor light emitting device.

As shown in FIG. 7, the semiconductor light emitting device 1 produced by the manufacturing method according to the present invention needs application of a voltage of only about 350 mV to allow a current of about 20 mA to be flown. On the other hand, the comparative semiconductor light emitting device needs application of a voltage of about 425 mV to allow a current of about 2 mA to be flown. The experiment results revealed that the semiconductor light emitting device 1 produced by the manufacturing method of the present invention can be operated with extremely low operating voltage compared to that of the comparative semiconductor light emitting device.

Hereinabove, the present invention is described in detail using the embodiment, but it is apparent to those skilled in the art that the present invention is not limited to the embodiment described in the specification. The present invention can be carried out as modified and changed modes without departing from the spirit and scope of the invention defined by the description of claims. Accordingly, the description of this specification is for illustrative purposes and does not impose any limitation on the present invention. Hereinbelow, a description is given of modifications obtained by partially modifying the embodiment.

Figure 8:
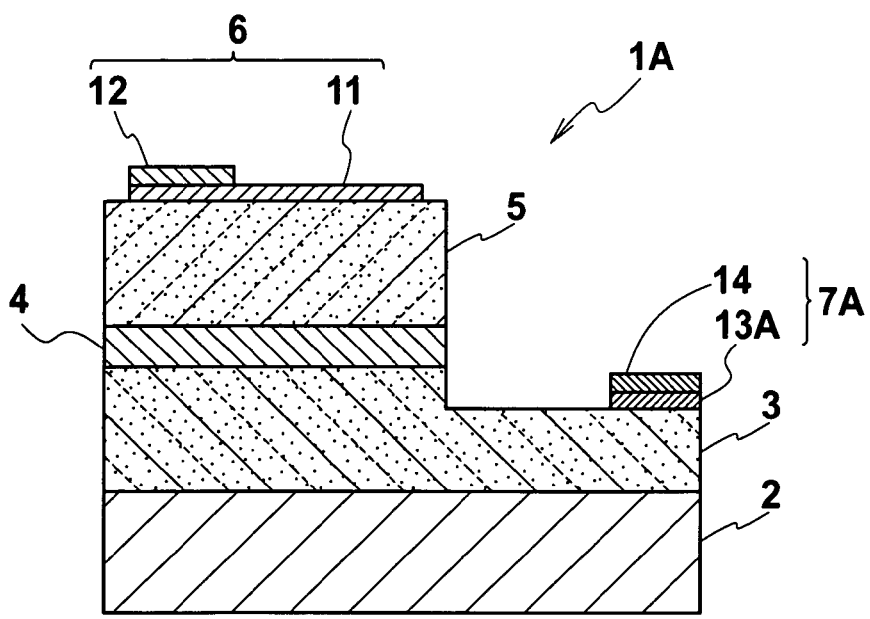
FIG. 8 is a view showing a cross-sectional structure showing a modification of the semiconductor light emitting device manufactured by the manufacturing method according to the present invention.

For example, like a semiconductor light emitting element 1A shown in FIG. 8, a first electrode layer 13A of the n-side electrode 7A may be formed so as to cover only a part of the exposed portion of the n-type semiconductor layer 3 exposed. Such a configuration allows the light emitted by the active layer 4 to be emitted to the outside in large amounts.

Figure 9:
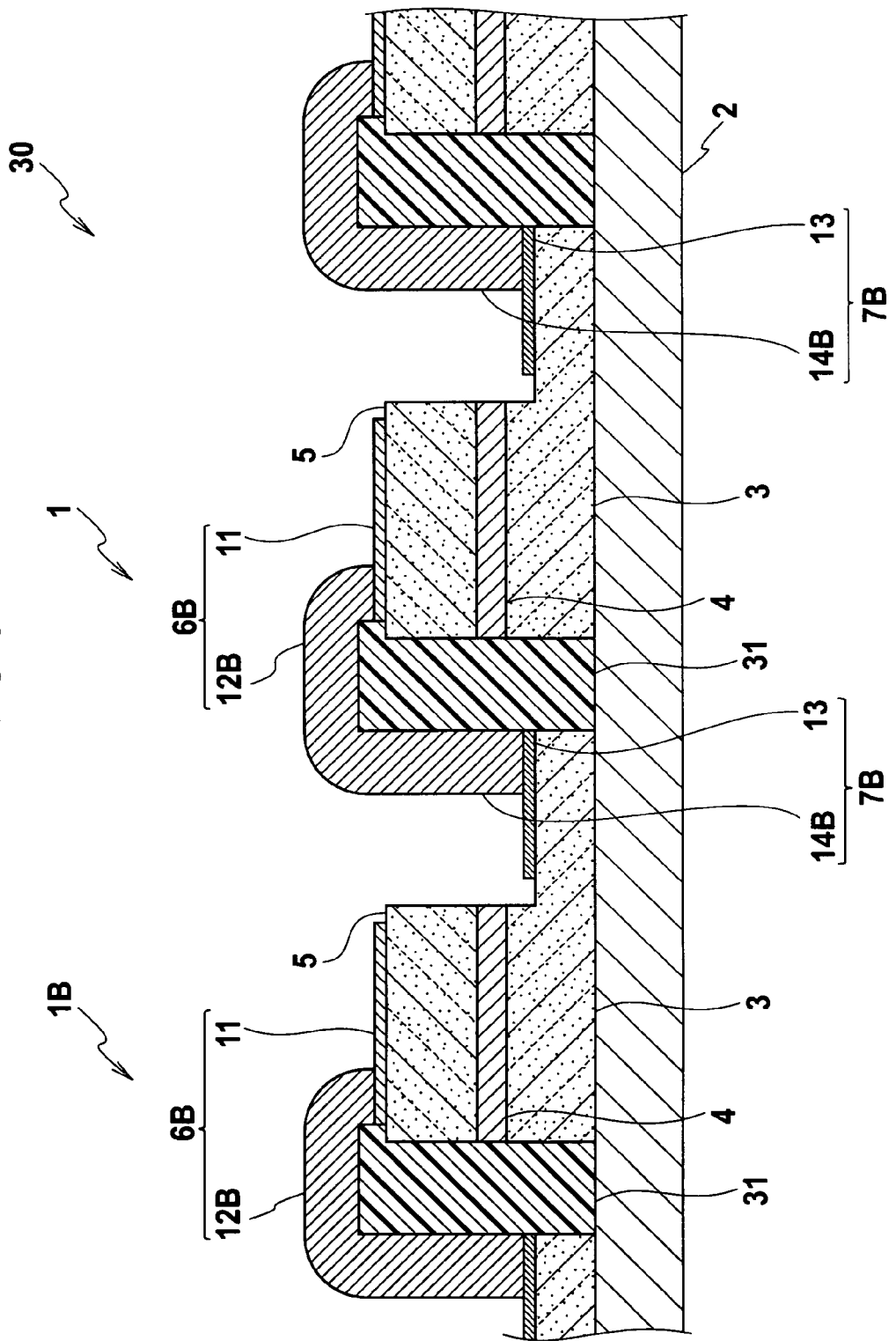
FIG. 9 is a view showing a cross-sectional structure of another modification of the semiconductor light emitting device manufactured by the manufacturing method according to the present invention.

Moreover, as shown in FIG. 9, the present invention may be applied to a light emitting unit 30 which includes a plurality of semiconductor light emitting elements 1B formed on a same substrate 2B and can be used in an AC power source. In the light emitting unit 30, the plurality of light emitting devices 1B are arranged on the substrate 2B, and p-side electrodes 6B of the semiconductor light emitting devices 1B are individually connected to n-side electrodes 7B adjacent thereto by the second metallic layers 12B and 14B. Moreover, insulating films 31 composed of $SiO_2$ are formed between the semiconductor light emitting devices 1B.

Moreover, in the aforementioned embodiment, the conditions of the first annealing step can be properly changed. Preferably, the annealing temperature at the first annealing step is changed in a range of about 500 to 800° C. Preferably, the annealing time at the first annealing step is changed in a range of about 5 to 30 minutes.

Moreover, the materials, thicknesses, shapes, and the like of the aforementioned embodiments are just examples and can be properly changed. For example, the thickness of the Ni layer constituting the first metallic layer can be about 500 Å, or the thickness of the Au layer can be about 2000 Å. The second metallic layer can be composed of Pd and Au layers, Pt and Au layers, or the like.

What is claimed is:

1. A method for manufacturing a semiconductor light emitting device having a p-side electrode and an n-side electrode, comprising:
   a semiconductor laminating step of laminating a plurality of nitride semiconductor layers to form a semiconductor laminated structure; and
   an electrode forming step of forming an electrode on at least one of the nitride semiconductor layers, the electrode forming step further including:
      a first metallic layer forming step of sequentially forming only an Ni layer and an Au layer constituting first metallic layers on a surface of a forming region of the n-side electrode,
      a first annealing step of annealing the first metallic layers in an atmosphere containing oxygen after the first metallic layer forming step,
      a second metallic layer forming step of sequentially forming a layer of a first metal and an Au layer constituting second metallic layers on a surface of the first metallic layers after the first annealing step, and
      a second annealing step of annealing the second metallic layers in a nitrogen atmosphere after the second metallic layer forming step.

2. The method for manufacturing a semiconductor light emitting device according to claim 1, wherein, in the electrode forming step,
   the first metallic layers are also sequentially formed on a surface of a forming region of the p-side electrode, simultaneously with forming the first metallic layers on the surface of the forming region of the n-side electrode, and
   the first metallic layers are annealed in the atmosphere containing oxygen after the first metallic layers are formed on the forming region of the p-side electrode.

3. The method for manufacturing a semiconductor light emitting device according to claim 1, wherein the first annealing step in the atmosphere containing oxygen is performed in an atmosphere at 500 to 800° C.

4. The method for manufacturing a semiconductor light emitting device according to claim 1, wherein the first annealing step is performed in an atmosphere containing nitrogen and oxygen.

* * * * *